(12) United States Patent
Lejeune

(10) Patent No.: US 6,426,643 B1
(45) Date of Patent: Jul. 30, 2002

(54) METHOD FOR THE TESTING OF ELECTRONIC COMPONENTS

(75) Inventor: Philippe Lejeune, Sours (FR)

(73) Assignee: Softlink, Za du Madre ( * ) Notice: Subject to any disclaimer, the term of this patent is extended or adjusted under 35 U.S.C. 154(b) by 0 days.

(21) Appl. No.: 09/608,812

(22) Filed: Jun. 30, 2000

(30) Foreign Application Priority Data

Jul. 5, 1999 (FR) .............................. 99 09055

(51) Int. Cl.$^7$ .............................. G01R 31/26
(52) U.S. Cl. ............ 324/765; 324/76.15; 702/117
(58) Field of Search .............. 324/765, 766, 324/767, 713, 607, 727, 76.15; 702/117, 112

(56) References Cited

U.S. PATENT DOCUMENTS

| | | | |
|---|---|---|---|
| 4,686,628 A | 8/1987 | Lee et al. .................. | 364/481 |
| 5,703,382 A | * 12/1997 | Hack ......................... | 257/72 |
| 6,049,220 A | * 4/2000 | Borden ...................... | 324/765 |
| 6,083,272 A | * 7/2000 | Nistler ....................... | 716/4 |

FOREIGN PATENT DOCUMENTS

FR 2749396 12/1997

\* cited by examiner

Primary Examiner—Michael J. Sherry
Assistant Examiner—Trung Q. Nguyen
(74) Attorney, Agent, or Firm—Nilles & Nilles SC

(57) ABSTRACT

A method for the testing of electronic components comprises an interface driving a test device. The interface can be parameterized according to the test. The test method provides for a first and only learning phase during which a measurement date that is the earliest possible date is determined. This method thereafter comprises the performance of adjusting phases to define adjusted measurement dates, used during an application phase. The adjusting phases are short, fast and precise, and are used to optimize the total performance time of a test and, simultaneously, also the profitability of production. Indeed, the measurement dates are determined with respect to the totalized populations.

20 Claims, 3 Drawing Sheets

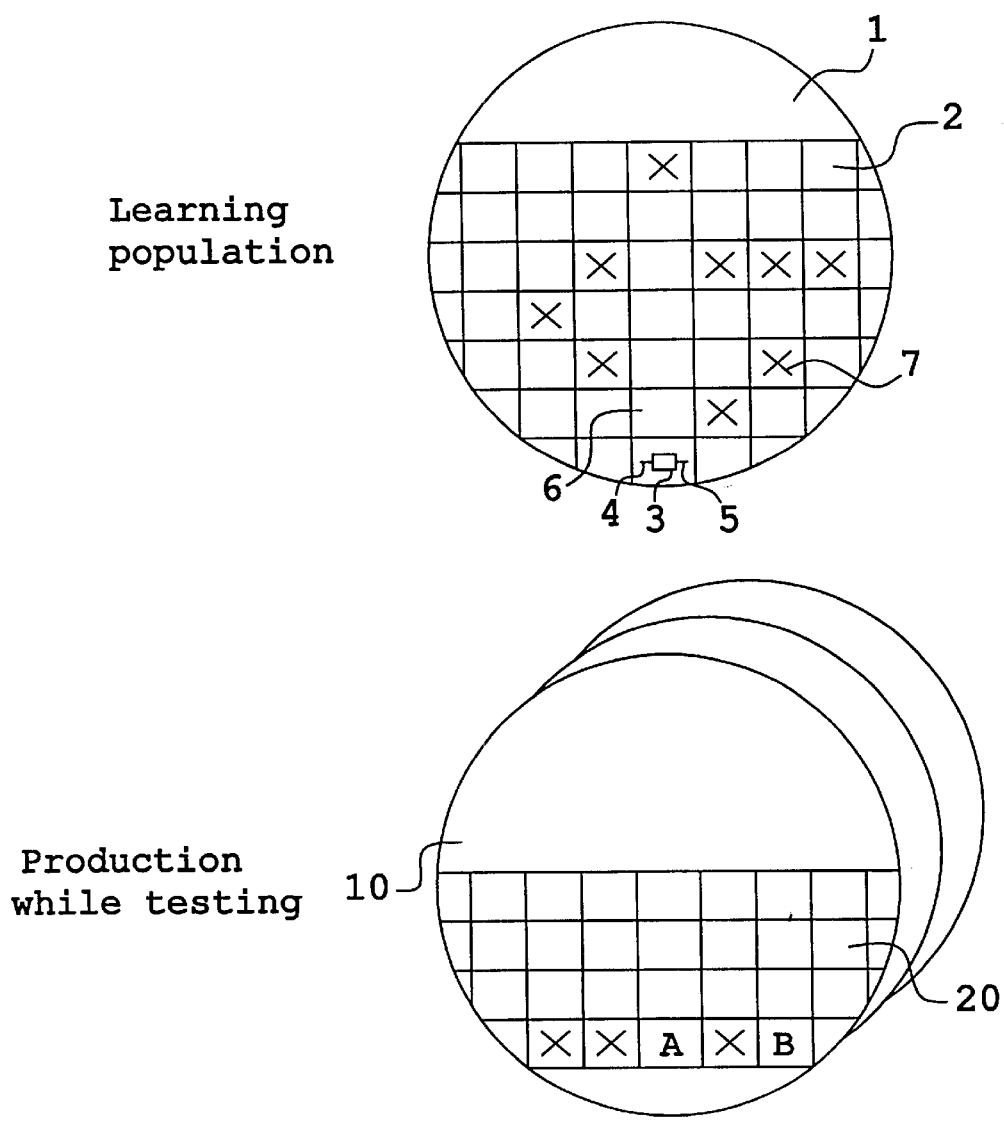
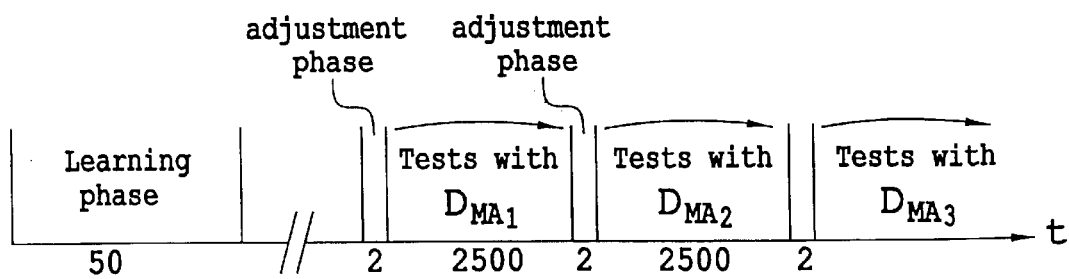

METHOD FOR THE TESTING OF ELECTRONIC COMPONENTS

BACKGROUND OF THE INVENTION

An object of the present invention is a method for the testing of electronic components. It can be used more particularly in the testing of semiconductor electronic components, especially components such as integrated circuits. In the prior art, there is a known method for the testing of electronic components that reduces the unit testing time of each component. The value of the invention lies in the fact that it proposes a test method that first of all reduces the unit testing time and, secondly, optimizes the output efficiency of the goods tested.

The invention is an improvement of the international patent No. WO 97/45748, published on Dec. 4, 1997. The subject matter of this international patent is incorporated herein by reference. An electronic component generally comprises several functions. It is therefore subjected to a series of tests to test each one of its functions. The test method according to the document WO 97/45748 can be applied to each of the tests of a series such as this. A test generally comprises several successive elementary steps. Thus a method for the testing of an electronic component comprises the following elementary steps:

at an initial date Di, terminals of the component, considered to be input terminals with respect to the test, are subjected to an electric potential Vi, there is a wait, during a period of time, for a response to appear and for this response to get stabilized at the terminals of this component, considered as output terminals with respect to this test, at the end of this period of time, at a measurement date DM, this response is measured. In one example, a value Vs of a potential at these output terminals is measured.

During the test, the component has thus been subjected to a signal, and the response of the component to this signal has been measured at the end of a certain period of time. Then, to find out if the component has given an acceptable result or not for this test, the measured response is compared with fixed criteria of acceptance. That is, in this example, the value of the potential Vs is compared with lower and/or higher limits of acceptance.

Since the electronic component has a known structure, it is possible to theoretically determine the period of time at the end of which an expected response can be observed at the output of the component following the application of a potential Vi at the input terminals of this component. With this theoretical time being known, for example as calculated by the designer of the electronic component, a nominal measurement date Do is determined for this test. The nominal measurement date Do is a date after the initial date Di. Moreover, the nominal measurement date is such that the duration that elapses between the initial date Di and this nominal date Do is greater than the duration of the theoretical time. Indeed, to define this nominal date Do a safety margin is chosen.

Then, the nominal date Do is used as a measurement date DM for the components to be tested. This choice, which gives preference to the guarantee of a result that complies with the test, leads to an increase in the total time of the performance of the test. Since this is true for all the tests of the series of tests applied to the component, the total testing time for such a component is thus very considerably increased.

The international application WO 97/45748 envisages a test method to decrease the period of time between the initial date Di and the measurement date Dm. Indeed, since the test method is designed to be applied consecutively to thousands, or even more, of electronic components that are themselves made in batches, the test method applied to the set of these components comprises, according to this document:

a first "learning phase" and
a second "application phase".

In the learning phase, a population of acceptable components of the batch to be tested is considered. The acceptable components are those that have given a good result in the test performed at a measurement date Dm equal to the nominal measurement date Do. This population is a "population for learning" hereinafter called a "learning population". In one example, this learning population may comprise a single electronic component.

Then, using the results obtained on this learning population, it is sought to define a measurement date that is the earliest possible measurement date. For this purpose, the test already performed on this learning population is reiterated, by again applying a signal to the input terminals and reading the value of the potential Vs at the output terminals on an intermediate measurement date Dmi, preferably prior to the nominal measurement date Do. If the learning population comprises a single component, then the same test is reiterated by using the same measurement date Dmi or Do to obtain several results for each of the dates tested.

Thus, a dichotomized or step-by-step procedure is carried out to test the measurement dates prior to the nominal date. To choose a measurement date from among these intermediate measurement dates Dmi tested, a comparison is made between:

a statistical image of the results of this learning population, obtained with an intermediate measurement date Dmi, and a statistical image of the results of this same learning population, obtained on the nominal measurement date Do.

Indeed, for each intermediate measurement date Dmi tested, a statistical image of the results obtained is determined. This statistical image especially comprises the calculation of the mean M, and of the standard deviation S. Furthermore, to compare two statistical images with each other, a criterion of statistical appreciation is used. This criterion requires knowledge of the mean values and standard deviation values of the images to be compared. This a criterion of appreciation D referenced Cpi is defined for each statistical image obtained for a measurement date Dmi. In one example, this criterion of appreciation CPi is equal to a ratio between a difference in limit and the standard deviation. The difference in limits can be given by a manufacturer's tolerance, for example To. Then CPi is equal to To divided by S.

To compare the statistical images with each other, their respective criteria of appreciation Cpi are compared. The earliest possible intermediate measurement date Dmi is chosen as the measurement date. This measurement date is furthermore such that the criterion of appreciation CPi is in a certain proportion of the criterion of appreciation CPo, where CPo is the criterion of appreciation characterizing the statistical image of the values measured at the nominal date Do.

The set of the statistical images determined for each of the intermediate measurement dates gives a representation of the evolution of the values measured at the output terminals after a signal VI has been imposed at the input terminals of this component.

In a first example, if for all the intermediate measurement dates Dmi tested, a wide range of values of the potential measured at the output is observed, without any predominance of any value, then it means that that the behavior of the electronic component under this test with these measurement dates is not reliable. Indeed, until the nominal measurement date Do, the potentials are fluctuating and are never correctly stabilized. In this case, it is impossible to choose a measurement date lower than the nominal measurement date.

In a second example, which is also unfavorable, even at the nominal measurement date Do, a curve is observed representing the values of non-stabilized potential measured at output. Then it is necessary to choose a measurement date which is higher than this nominal date.

In a third example, the representation of the evolution of the values measured at the exit of the electronic component is a curve plotted with a thin line. It is possible then to consider intermediate measurement dates that are correlated with the nominal measurement date. However, even in this example, it is possible to define a minimum measurement date, below which the statistical images of the results obtained with measurement dates lower than this minimum date are not consistent. For example, the result observed with the intermediate measurement date must remain within limits of acceptance imposed on the results obtained with the nominal measurement date.

The test method provides for the choice of an intermediate measurement date that is the earliest possible date but stipulates that this intermediate measurement date will, however, be higher than the minimum date.

Then this intermediate measurement date selected during the learning phase is applied as a measurement date DM for all the other electronic components to be tested. This intermediate measurement date is thus applied continuously during the application phase.

The approach proposed in the international application WO 97/45748 has several problems. A first problem of this method is the fact that it is necessary to carry out a learning phase prior to the testing of a batch of components. However this learning phase is lengthy, and entails loss of time. Moreover, the intermediate measurement date determined during this learning phase may be the cause of a higher rate of rejection of the electronic components tested during the application phase.

Given the duration of the learning phase, it cannot be done too frequently. The method therefore leads to the application of a measurement date not suited to a part of the batch to be tested. It is not possible, with the learning phase, to give the optimum intermediate measurement date for reducing the test time and also the optimum date for the profitability of the output tested. Indeed, if the learning phase has led to the choice of an excessively early intermediate measurement date, then many electronic components will fail the test carried out at this measurement date during the application phase. These components then will be wrongly removed from the standard output, and the ultimate profitability of the goods tested will be lower than the profitability that would have resulted from the performance of a test with a later measurement date.

It is an object of the invention to overcome the problems referred to by proposing a test method comprising a single learning phase whose teaching can be re-used during the test method application phase. In addition, the test method according to the invention proposes phases of adjustment of the measurement date during the application phase. Thus, regularly, for example at the end of a given number of parts tested, the measurement date is adjusted so that it is always optimized with respect to the duration of the testing of the production in progress, and optimized with respect to the profitability of this tested production. Indeed, since the characteristics of the production to be tested may be variable in time, the same measurement date cannot be applied continuously. It is necessary to adapt the measurement date to the specific characteristics of the production to be tested. Indeed, the characteristics of the output to be tested may be different in the course of time. And yet, it is not necessary to set aside these parts of the production from the population of acceptable components.

Furthermore, the invention proposes a test method in which the measurement date to be applied to a batch of components is determined by taking account of the intrinsic characteristics of the components to be tested. For this purpose, to determine the earliest possible measurement date, a population totalized by means of a criterion is considered. The totalized population comprises one or more components.

In a first example, a statistical image of this totalized population comprises results of this component or components obtained with distinct measurement dates. The operation of considering the population totalized according to this first example can be used as much during a learning phase as during an adjustment phase. In particular, the components of the population "totalized" on the nominal measurement date are tested, a nominal statistical image is determined, the same components are tested on intermediate measurement dates, a statistical image is considered of the totalized population comprising all the results obtained with the nominal measurement date and those obtained with an intermediate measurement date, the statistical image of the totalized population is compared with the nominal statistical image by means of a criterion to determine if the intermediate measurement date incorporated into the totalized population can be chosen as the measurement date for the application phase.

In an alternative embodiment, a statistical image of this totalized population comprises results of components coming from different sources, but tested with same measurement dates. Then, this totalized population comprises, firstly, the acceptable components analyzed during the learning phase, and secondly the acceptable components of the adjustment phase. The components of the adjustment phase are acceptable components coming from the output tested during the application phase.

During this adjustment phase, a population of acceptable components is considered. For each adjustment phase, a totalized population is considered.

For each of the components of the learning phase, the measured values obtained at the various measurement dates are known. On the other hand, for the acceptable components considered during the adjustment phase, initially, only the value measured at the nominal measurement date is known. Only the acceptable components for a nominal measurement date can be included in the population of the adjustment phase. For these components of the adjustment phase, it is sought to establish the value measured at intermediate measurement dates earlier than the nominal measurement date. For each component contained in the population of the adjustment phase, the following step is carried out individually:
- the value of the potential measured with different intermediate measurement dates is determined,
- for each intermediate measurement date tested, the result of the component considered is included in the distribution of the results of the learning population, obtained for this intermediate measurement date,
- a statistical image of this totalized population of values obtained on an identical measurement date is considered,
- this statistical image of the totalized population is compared, by means of a criterion, with a statistical image of the learning population for values obtained on this same intermediate measurement date,
- an adjusted intermediate measurement date is chosen such that this adjusted measurement date is higher than or equal to the earliest measurement date given for learning population, and such that a criterion of appreciation of the statistical image obtained for the totalized population is acceptable in comparison with a criterion of appreciation of the statistical image of the learning population obtained for this same adjusted measurement date.

SUMMARY OF THE INVENTION

An object of the invention is a method for the testing of electronic components in which
- terminals of a component are subjected, at an initial date, to an electric potential,
- a value of potential set up at terminals of this component is measured at a measurement date, and
- this measured value of potential is compared with limits of acceptance, in order to accept or reject the component as a function of this comparison,
- the measurement date is determined, during a learning phase preliminary to an application phase, by means of a criterion applied to a population of accepted components, in considering a statistical image of this population of accepted components,
- the earliest possible date is chosen as a measurement date, wherein:
  - the measurement date determined is adjusted in the course of at least one adjustment phase during the application phase.

An object of the invention is a also method for the testing of electronic components in which
- terminals of a component are subjected, at an initial date, to an electric potential,
- a value of potential set up at terminals of this component is measured at a measurement date, and
- this measured value of potential is compared with limits of acceptance, in order to accept or reject the component as a function of this comparison,
- the measurement date is determined by means of a criterion applied to a population of accepted components, in considering a statistical image of this population of accepted components,
- the earliest possible date is chosen as a measurement date, wherein
  - the population of accepted components considered is a totalized population comprising a total of a reference population and a population of acceptable components taken out of an application phase.

BRIEF DESCRIPTION OF THE DRAWINGS

The invention will be understood more clearly from the following description and from the accompanying drawings. These drawings are given purely by way of an indication and in no way restrict the scope of the invention. Of these figures:

FIG. 1 shows the components of a learning population, an adjusting population and an application population according to the invention;

FIG. 2 is a timing diagram showing the arrangement in time of the learning phase, the adjustment phases and the application phases according to the invention;

MORE DETAILED DESCRIPTION

Figure 3:
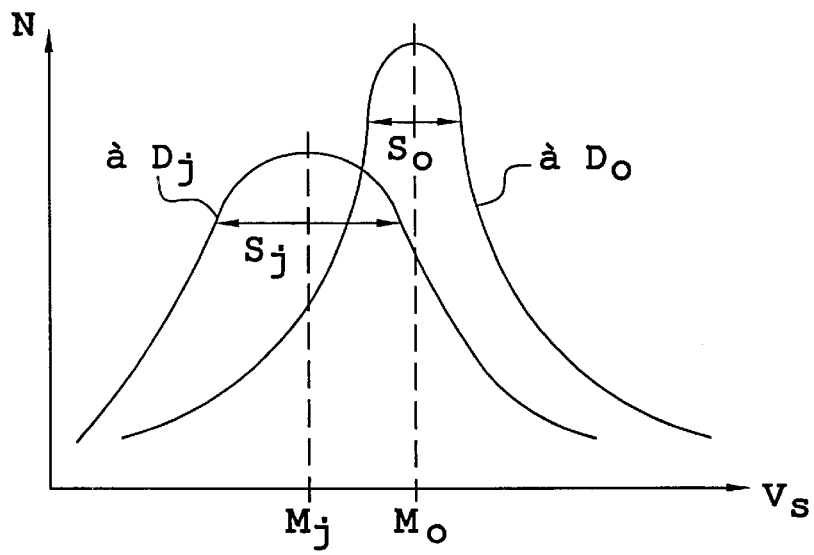
FIG. 3 shows a view of the distribution of the results of the testing of a learning population according to the invention, pour measurement dates tested.

FIG. 1 shows a wafer 1 bearing electronic components 2. This wafer may have a circular shape or else a parallelepiped shape known as a strip. The electronic components 2 of the wafer 1 are, for example, integrated circuit chips. An electronic component 2 comprises at least one function 3 to be tested. To test the function 3 of the electronic component 2, a potential Vi is applied to conductive terminals 4 of the electronic component 2. The terminals 4 are considered to be input terminals to perform the test of the function 3. The electronic component 2 comprises conductive terminals 5. These conductive terminals 5 are output terminals for the test performed.

Indeed, a response to the test is awaited at the terminals 5. A response awaited at the terminals 5 is generally the value of an output potential Vs. To test the function 3 of the electronic component 2, the invention uses a test device comprising a first set of electrodes that apply the potential Vi to the input terminals 4, and a second set of electrodes that pick up the output potential Vs at the output terminals 5. An interface of the test device manages the sending of the electrical signals and the measurement of the picked-up signals. The interface is configured by testing means of the testing device. The configuration of the interface is used to process the signals sent and received by it. In particular, the interface is used to decide whether the component is acceptable or unacceptable with respect to the test performed.

In a first learning phase shown in FIG. 2, electronic components are tested with a measurement date equal to the nominal measurement date Do. The tests performed with a nominal measurement date Do are identical to those performed in the prior art. In the invention, following this first test, acceptable components 6 and unacceptable components 7 are identified on the wafer 1. Only the acceptable components 6 are considered to form a learning population. In general, the learning population has only one component.

FIG. 3 gives a view of the distribution of the components of the learning population as a function of the value Vs read at a nominal measurement date Do. This distribution is generally Gaussian. It is a statistical image, established for a given measurement date, of the learning population. This distribution is characterized by the value of a mean Mo and a standard deviation So. Given that the nominal measurement date Do is chosen with a big safety margin, the standard deviation So is generally small.

Then, the distribution of the components of this learning population is determined as a function of the value Vs read at the output terminals of the components for different intermediate measurement dates. These measurement dates are preferably prior to the nominal measurement date Do. Thus, statistical images of the learning population are defined for prior intermediate measurement dates. For example, as shown in FIG. 3, a representation is obtained of the distribution of the learning population for a measurement date Dj, earlier than the nominal measurement date Do. This distribution, or statistical image, on the measurement date Dj is characterized by a mean Mj and a standard deviation Sj. The representation of the distribution on the measurement date Dj may be different from the distribution observed on the nominal measurement date. Indeed, the standard deviation Sj may be different from the standard deviation So. Generally, the standard deviation Sj, obtained for a measurement date Dj prior to the nominal date Do, is greater than a standard deviation So. Furthermore, if the behavior of an electronic component with respect to the test performed is not perfectly repeatable, then a gradual reduction of the standard deviation will be observed as and when the nominal measurement date is approached.

In one variant, it is possible to consider, for each intermediate measurement date, an intermediate totalized statistical image comprising both the results (the value Vs) obtained by these components on the nominal measurement date and the intermediate measurement date. In the same way as in FIG. 3, it is possible to obtain an intermediate totalized statistical image of the type characterized by the standard deviation Dj and the mean Mj.

Figure 4:
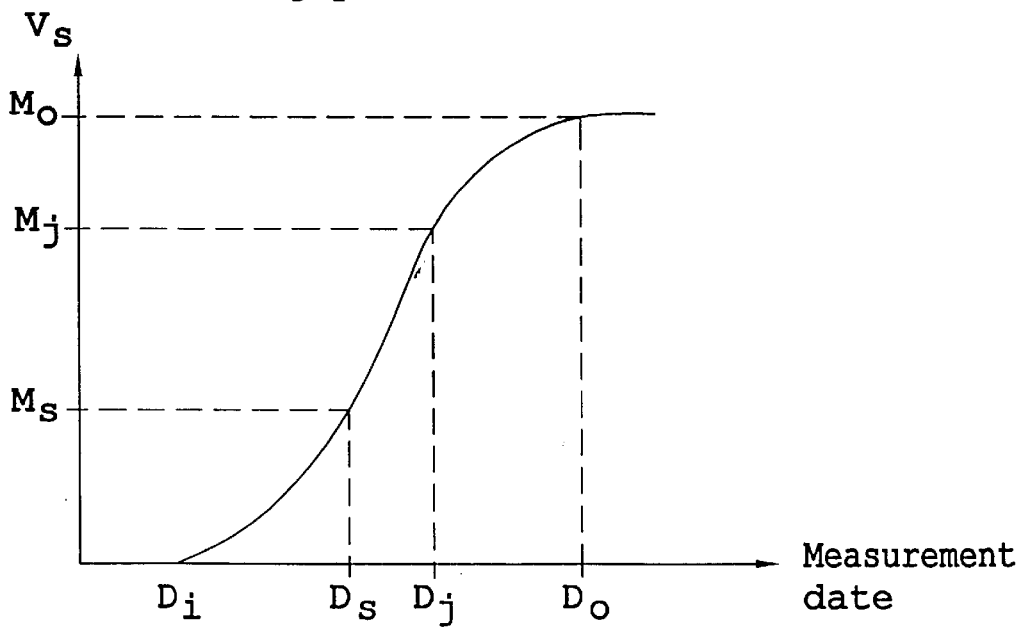
FIG. 4 shows a view of the progress of the results of the test performed on a learning population according to the invention, as a function of the measurement date.

FIG. 4 gives an exemplary simple view of the progress of the mean of the values Vs observed for the learning population as a function of the measurement date used. This example shows a growing increase in the value of the mean Ms, and it is observed that, beyond a nominal measurement date Do, the value of the observed potential Vs remains equal to the mean Mo Furthermore, it is possible to define a measurement date Ds, the minimum threshold date below which the distribution of the learning population, as a function of the value Vs read at the output terminal 5, is no longer consistent. Indeed, the standard deviation Ss of the learning population at this date Ds, is far too great to allow for an interpretation of the data obtained. In one variant, this date Ds may be defined as a function of the mean Ms with respect to fixed criteria.

Thus, during the learning phase, the earliest possible measurement date Dj is chosen. Dj is chosen between the minimum threshold value Ds and the nominal value Do.

To choose the measurement date Dj, it is possible to use the test method presented in the international patent application WO 97/45748, especially by using a criterion of appreciation CPK. For each measurement date, it is possible to determine a distinct CPK. Thus it is possible to compute a CPKo corresponding to the data elements pertaining to the learning population for the nominal measurement date Do. It is also possible to compute criteria of appreciation CPKj for each measurement date Dj. It is possible, in one variant, to compute criteria of appreciation CPKjc for the intermediate totalized statistical images respectively representing each intermediate measurement date. In general CPK is defined as follows:

$$CPK = \text{MIN}|\text{mean of the values} - \text{lower limit}|/S$$
$$|\text{mean of the values} - \text{upper limit}|/S$$

For example, $$CPKo = \text{MIN}\{|\text{Mo} - \text{lower limit}|/So; |\text{Mo} - \text{upper limit}|/So\}$$

The terms between the two vertical strokes are terms taken in absolute value. The upper and lower limits needed to compute CPK are fixed by the manufacturer. They are generally expressed in upper and lower limits of the potential Vs when this potential is measured at a nominal measurement date Do.

The different statistical images of the learning population are represented by these criteria of appreciation CPK.

In one variant, it is possible to determine upper and lower limits for the values measured at measurement dates lower than the nominal date. In this case, a transfer function is used to convert these known upper and lower limits. For example, this transfer function may be like that of the function shown in FIG. 4.

Then, to choose the earliest possible measurement date Dj, it is necessary for the corresponding criterion of appreciation CPKj or CPKjc to fulfil a certain condition with respect to the criterion of appreciation CPKo of the values recorded at a nominal measurement date of the learning population.

In the invention it is planned that this earliest possible measurement date Dj chosen at the time of the learning phase will be validated, as the case may be, in the course of an adjusting phase during the phase of application of the test method according to the invention.

Indeed, each output, each manufacturing batch, each wafer has a certain homogeneity in its characteristics. Thus, it may be chosen to define a new measurement date for each new manufactured batch, each wafer, or at yet another frequency. According to the test method of the invention, therefore, before testing a new batch of components, there is provided an adjusting phase. This adjusting phase is much faster than the learning phase, and it enables the choice of a measurement date adjusted to the characteristics of the batch to be tested: Dma.

Thus, as shown in FIG. 1, a first wafer 10 bearing electronic components 20 is considered. Before starting the analysis of the wafer in a phase known as the application phase, the measurement date Dma is first of all defined during an adjusting phase. During this adjusting phase, components A, B of the wafer 10 are tested with a nominal measurement date Do. The expectation is to find a finite and determined number of electronic components that meet the requirements of the test to be able to demarcate the population of the adjusting phase.

The set of response values Vs characterizing the components of the learning population, like the adjusting population, may be obtained successively after several iterations of the same test with different measurement dates or else all together through the use of a sample-and-hold device.

A preferred example looks at a totalized population during the adjusting phase. This totalized population corresponds to the total of a population of acceptable components, coming from the learning population, and secondly from the production in progress, with the learning population possibly also coming from production in progress. Indeed, the characteristics of the learning population may be memorized in the form of a database. This learning population can then serve as a reference for all the finalizing operations or adjustments of the measurement date that will subsequently take place. In this case, the totalized population corresponds to several components tested progressively in space.

In another variant, the totalized population of the adjustment phase corresponds to one or, as the case may be, to several components tested with the test method according to the invention, several times successively and identically in time.

According to this preferred example of the invention, the population of the adjustment phase comprises the learning population and acceptable electronic components considered at the start of the batch. For example, the learning population comprises 50 electronic components, and the population sampled at the beginning of the batch comprises only one electronic component, namely for example the electronic component A of the wafer 10. The population considered during the adjustment phase is therefore a totalized population comprising 51 electronic components. These 51 electronic components are all acceptable for a test performed on a nominal measurement date Do. Then, for this acceptable electronic component of the totalized population coming from the production in progress, the value of the potential Vs observed will be determined for measurement dates between Dj and Do. On the obtaining of each new measurement, this data element is incorporated into the set of data of the learning population corresponding to this same measurement date.

Figure 5:
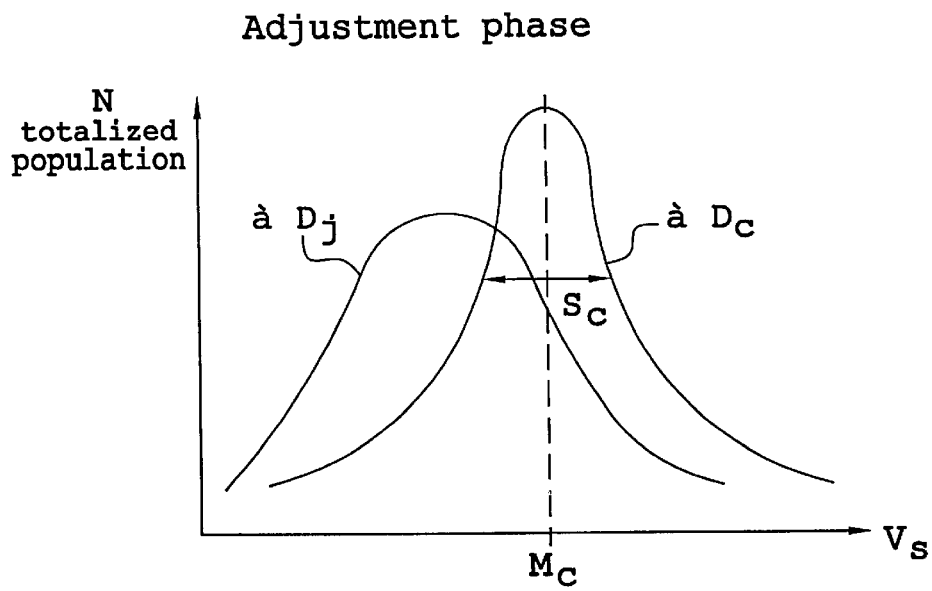
FIG. 5 is a view of the distribution of the results of the testing of an adjusting population according to the invention, for tested measurement dates.

FIG. 5 represents a distribution of the totalized population as a function of the value Vs read for a given measurement date Dc. This distribution is characterized by a standard deviation Sc and a mean Mc. Thus, for the population thus totalized, Mc and Sc are known. By using the same limits of acceptance as those defined for the learning population, the coefficient of appreciation CPKc of the totalized population is computed. The coefficient of appreciation CPKc is defined as follows:

$$CPKc = \text{MIN}|Mc - \text{lower limit}|/Sc$$

$$|Mc - \text{upper limit}|/Sc$$

Then, to determine an adjusted measurement date Dma, an approach is made, preferably step by step, starting from the value Dj defined during the learning phase. Thus, an adjusted measurement date Dma is determined. Dma is greater than or equal to this value Dj. The approach to find a right value of Dma may also be a dichotomized type of approach.

Figure 6:
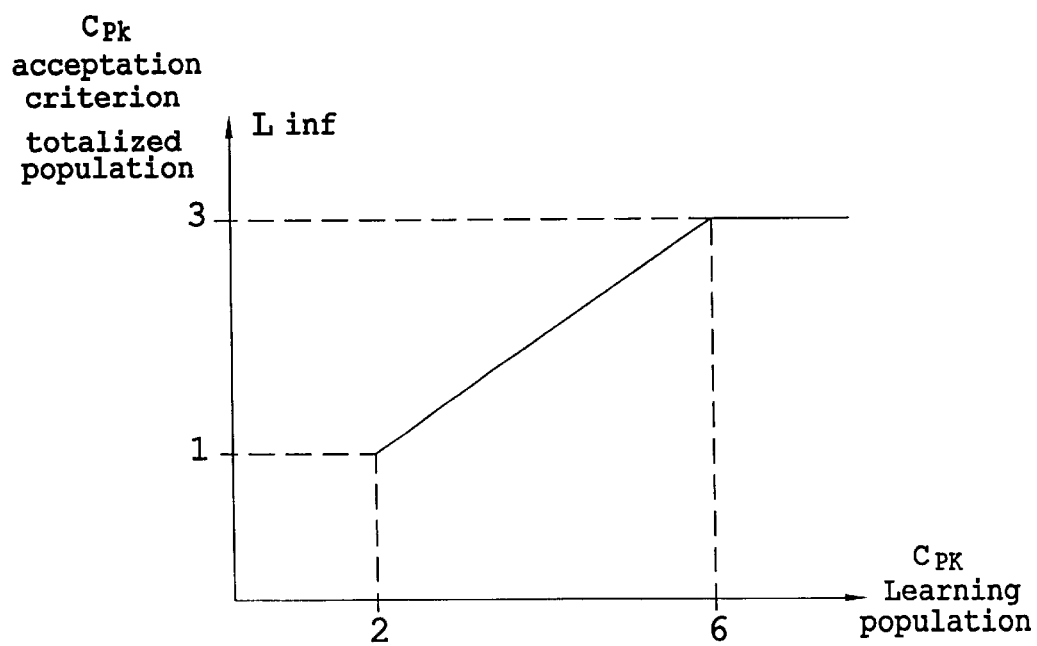
FIG. 6 is a graph showing the progress of the criterion of comparison, in the invention, of the criteria of appreciation if the different statistical images according to the invention.

In any case, the value of the earliest measurement date Dma is chosen such that the criterion of appreciation CPKc is above a lower limit Linf. For a computed coefficient CPKc, corresponding to a given measurement date Dc, the graph shown in FIG. 6 is used to determine the value of the lower limit Linf. Linf is determined as a function of the value of the criterion of appreciation CPK of the learning population. In a first variant, Linf is determined as a function of the value CPK of the learning population corresponding to the measurement date Dc considered. In a second variant, Linf is determined as a function of the criterion of appreciation CPKo obtained for the nominal measurement date.

According to the graph shown in FIG. 6, for any value of the coefficient of appreciation CPK of the learning population greater than or equal to 6, the method tolerates the choice of a measurement date Dc such that the coefficient of appreciation of the totalized population CPKc is greater than the value 3. Generally, for a test whose repeatability is very good, the coefficient of appreciation of the learning population is of the order of 1000, and hence the lower limit Linf used is 3.

In a second example, if the repeatability of the test is moderately good, then if the coefficient of appreciation CPK of the learning population is between 2 and 6, the lower limit proposed for the coefficient of appreciation CPKc of the totalized population is a linear increasing function, for example of the type:

$$\text{Linf} = \tfrac{1}{2} \text{ CPK of the learning population}$$

In a third example, if the coefficient of appreciation CPK of the learning population is below the value 2, then it means that the repeatability of the test is too poor for the test to be capable of being optimized. Therefore, there is no lower limit Linf to be applied to the criterion CPKc of the totalized population, for there is no optimization to be obtained.

In the alternative embodiment of the invention, the population of the adjustment phase comprises only acceptable electronic components considered at the beginning of a batch of components to be tested. For example, this population comprises only one component A.

To obtain statistical images from a single component, iterations of one and the same test are performed, possibly with different measurement dates. In a preferred example, 5 iterations of the test are performed with the nominal measurement date Do. Thus a statistically nominal image CPKnom of this component A is defined.

$$CPKnom = \text{MIN}\{|Mnom - \text{lower limit}|/Snom$$

$$|Mnom - \text{upper limit}|/Snom\}$$

The upper and lower limits needed to compute CPK are fixed by the manufacturer. They are generally expressed in upper and lower limits of the potential Vs when this potential is measured at a nominal measurement date Do.

Mnom corresponds to the mean of the values (Vs) obtained during the 5 iterations with the date Do. Similarly Scj corresponds to the standard deviation of these values.

Then 2 iterations of the test are performed on this same component with a different measurement date. This different measurement date may have been determined for example during the learning phase and corresponds in this case to the intermediate measurement date Dj. This date may also be chosen between Dj and Do, step by step or in a dichotomized way, in order to test an adjusted measurement date.

Then, a totalized statistical image is determined. This statistical image comprises inter alia the results obtained by iterations performed with a measurement date different from the nominal measurement date, and comprising the results obtained following the iterations made with the nominal measurement date Do. There is computed, for example, a criterion of appreciation CPKcj defined as follows:

$$CPKcj = \text{MIN}\{|Mcj - \text{lower limit}|/Scj; |Mcj - \text{upper limit}|/Scj\}$$

The upper and lower limits needed to compute this CPK are fixed by the manufacturer. They are generally expressed in upper and lower limits of the potential Vs when this potential is measured at a nominal measurement date Do.

Mcj corresponds to the mean of the values (Vs) obtained during the five iterations with the date Do and the values obtained during the two iterations with a date Dj. Similarly Scj corresponds to the standard deviation of these values.

The tested measurement date Dj is accepted as an adjusted measurement date if the statistical image, for example CPKcj, meets certain criteria. For example CPKcj must be greater than a tolerance to validate the date Dj, with this tolerance for example being equal to 3. In one variant, if CPKnom is in the range of 3 to 6, this tolerance may be determined as a function of the value of CPKnom. The tolerance may then be defined as follows:

Tolerance=f1*CPKnom

With f1 being a real value ranging for example between 0 and 1.

In a preferred example of the invention, this adjusting method is reiterated so as to determine a second adjusted measurement date Dma'. In this case, the highest adjusted measurement date of the two adjusted measurement dates Dma and Dma', is chosen. In this example, the second adjusted measurement date is defined from a second totalized population.

This second totalized population is defined as the first from an electronic component other than the component A. In a preferred example of the invention, this second population of the production in progress comprises only one electronic component B, distinct from the first adjusting population.

The adjustment phase thus organized is used to quickly determine a measurement date adjusted to the production in progress while, at the same time, ensuring that a measurement date does not give rise to an excessive rate of unnecessary discards, for the information used is reliable and representative information obtained during the learning phase. The adjusted measurement date is then applied to the goods during the application phase. For example, this adjusted measurement date is applied to a fixed given number of electronic components to be tested. In FIG. 2, it is proposed to test 2500 consecutive electronic components with the same adjusted measurement date Dma1. Then, this first adjusted measurement date Dma1 lapses and a new adjustment phase is carried out to define a second adjusted measurement date Dma2 to depict the characteristics of the tested production in progress in a manner that is as close to reality as possible.

In the example shown in FIG. 4, if the progress of the value of Vs is simple, it may be planned to use a transfer function. When a measurement date is used, whatever it be, whether it is a nominal measurement date, an intermediate measurement date or an adjusted measurement date, the transfer function is used to convert the measured value for each electronic component tested during the current production into a computed value of the potential that would have been obtained if it had been measured on the nominal measurement date. This computed value is then compared with the lower and upper limits fixed for measurements made on this nominal measurement date.

In one variant of the invention, it is possible to use a reverse transfer function to convert the limits defined for the measurements made on the nominal measurement date Do into lower and upper limits to be applied for measurements made at an adjusted measurement date. In this example, it is not necessary to convert the measured values for each of the components.

What is claimed is:

1. A method for testing a batch of electronic components (2), wherein each component has a conductive region formed thereon and a predetermined range of acceptable performance values associated therewith, the method comprising the steps of:

applying a first electrical signal of an electric potential (Vi) to an electrode terminal (4) that is electrically coupled to a conductive region of each component, wherein the first signal is applied by testing system at an initial date (Di);

measuring a value of potential (Vs) of a second electrical signal response to the first electrical signal applied to the electrode, wherein the second signal is measured at a terminal (5) that is electrically coupled to a conductive region of the component, by the testing system at a measurement date (Dm); and comparing the measured value of potential with limits of acceptance, in order to accept or reject each component as a function of the comparison, wherein the measurement date is the earliest possible date determined during a learning phase preliminary to an application phase by means of a criterion applied to a population of accepted components, in considering a statistical image of the population of accepted components, the application phase corresponding to the phase during which the testing system is testing each of the components, and wherein the testing system adjusts the measurement date in the course of at least one adjustment phase during the application phase.

2. A method according to claim 1, wherein the population of accepted components considered during the adjusting phase is a totalized population comprising a total of a reference population and a population of acceptable components taken out of an application phase.

3. A method according to claim 2, wherein the reference population is a population of acceptable components coming from the learning phase.

4. A method according to claim 2, wherein a statistical image (PKC), obtained at an intermediate date, of the totalized population of accepted components is compared with a statistical image of the reference population obtained for the same intermediate date.

5. A method according to claim 1, wherein the statistical image of the totalized population comprises an evaluation of the mean (Mc) of the values represented in the totalized population.

6. A method according to claim 1, wherein the statistical image of the totalized population comprises an evaluation of the standard deviation (Sc) of the values represented in the totalized population.

7. A method according to claim 1, wherein the criterion of comparison of the statistical images comprises an evaluation of the ratio between a first quantity, equal to the absolute value of the difference between the mean of the totalized population and a limit tolerated for the mean, and a second quantity, equal to the standard deviation of the totalized population.

8. A method according to claim 1, wherein a measurement date is chosen such that the criterion of comparison is above a threshold (Linf), and wherein the measurement date is applied until a new adjustment of the chosen adjusted measurement date.

9. A method according to claim 8, wherein the threshold is chosen by applying a linear function to a value of a second ratio between an absolute value of the difference between a mean of the reference population and a limit tolerated for this mean, and a standard deviation of this population of reference.

10. A method according to claim 9, wherein the linear function comprises a first increasing linear form on a first interval of value of the second ratio, and a second constant linear form on a second interval of this second ratio.

11. A method according to claim 1, wherein for the selected measurement date, the limits of acceptance to be applied to the values of potential of the components to be tested are chosen, and components whose measured values, at the measurement date, are compatible with these limits of acceptance are chosen as acceptable.

12. A method according to claim 1, wherein a new adjustment phase of the measurement date is carried out after using the chosen measurement date on a given number of components.

13. A method according to claim 1, wherein successive iterations of the method are performed to determine the earliest possible measurement date, wherein at each iteration, a new population of acceptable components extracted from the production of the current phase are considered, and wherein a latest measurement date proposed by each iteration is chosen.

14. A method according to claim 13, wherein two iterations are performed, and wherein at each iteration, a population of accepted components comprising only one accepted component is considered.

15. A method for testing a batch of electronic components (2), wherein each component has a conductive region formed thereon and a predetermined range of acceptable performance values associated therewith, the method comprising the steps of:

applying a first electrical signal of an electric potential (Vi) to an electrode terminal (4) that is electrically coupled to a conductive region of each component, wherein the first signal is applied by testing system at an initial date (Di);

measuring a value of potential (Vs) of a second electrical signal response to the first electrical signal applied to the electrode, wherein the second signal is measured at a terminal (5) that is electrically coupled to a conductive region of the component, by the testing system at a measurement date (Dm); and comparing the measured value of potential with limits of acceptance, in order to accept or reject each component as a function of the comparison, wherein the measurement date is the earliest possible date determined during a learning phase preliminary to an application phase by means of a criterion applied to a population of accepted components, in considering a statistical image of the population of accepted components, the application phase corresponding to the phase during which the testing system is testing each of the components, and wherein the population of accepted components considered is a totalized population comprising a total of a reference population and population of acceptable components taken out of an application phase.

16. A method according to claim 15, wherein the population of accepted components considered during the adjusting phase is a totalized population comprising a total of a reference population and a population of acceptable components taken out of an application phase.

17. A method according to claim 16, wherein the reference population is a population of acceptable components coming from the learning phase.

18. A method according to claim 16, wherein a statistical image (PKC), obtained at an intermediate date, of the totalized population of accepted components is compared with a statistical image of the reference population obtained for the same intermediate date.

19. A method according to claim 15, wherein the statistical image of the totalized population comprises an evaluation of the mean (Mc) of the values represented in the totalized population.

20. A method according to claim 15, wherein the statistical image of the totalized population comprises an evaluation of the standard deviation (Sc) of the values represented in the totalized population.

* * * * *